United States Patent [19]
Fosnight

[11] Patent Number: 5,980,183
[45] Date of Patent: Nov. 9, 1999

[54] INTEGRATED INTRABAY BUFFER, DELIVERY, AND STOCKER SYSTEM

[75] Inventor: William J. Fosnight, Austin, Tex.

[73] Assignee: Asyst Technologies, Inc., Fremont, Calif.

[21] Appl. No.: 08/843,245

[22] Filed: Apr. 14, 1997

[51] Int. Cl.⁶ ..................................................... B65G 1/00
[52] U.S. Cl. ..................... 414/222.01; 414/281; 414/940
[58] Field of Search .................................... 414/222, 225, 414/281, 940, 222.01, 225.01

[56] References Cited

U.S. PATENT DOCUMENTS

| | | | |
|---|---|---|---|
| 4,005,786 | 2/1977 | Adelson et al. | 414/281 |
| 4,787,804 | 11/1988 | Edenas | 414/281 |
| 4,964,776 | 10/1990 | Wakita et al. | 414/940 X |
| 5,163,802 | 11/1992 | Poinelli | 414/940 X |
| 5,363,867 | 11/1994 | Kawano et al. | 414/940 X |
| 5,387,265 | 2/1995 | Kakizaki et al. | 414/940 X |
| 5,411,358 | 5/1995 | Garric et al. | 414/940 X |
| 5,443,346 | 8/1995 | Murata et al. | 414/940 X |
| 5,464,313 | 11/1995 | Ohsawa | 414/940 X |
| 5,562,383 | 10/1996 | Iwai et al. | 414/940 X |
| 5,570,990 | 11/1996 | Bonora et al. | 414/940 X |
| 5,628,604 | 5/1997 | Murata et al. | 414/940 X |

FOREIGN PATENT DOCUMENTS

| | | | |
|---|---|---|---|
| 158508 | 6/1992 | Japan | 414/940 |
| 294410 | 11/1993 | Japan | 414/940 |
| 299489 | 11/1993 | Japan | 414/940 |

Primary Examiner—David A. Bucci
Attorney, Agent, or Firm—Fliesler, Dubb, Meyer & Lovejoy LLP

[57] ABSTRACT

An integrated intrabay buffer, delivery, and stocker system including a pair of shuttles, capable, by themselves, of transferring a pod in an X–Z plane between the interbay transport system, the I/O ports of various process tools and a plurality of storage shelves provided along the wall of the tool bay. Advantageously, the present invention integrates together the process tools within a tool bay by providing a single transport mechanism shared by each tool, and by providing a single, large storage and buffer area for pods that is shared by each tool. This increases reliability and flexibility, and simplifies the hardware and software control. Additionally, the storage shelves may be provided above some or all of the process tools within the tool bay. Such an arrangement offers a substantially greater number of spaces to store a pod as compared to conventional tool bays. Moreover, as the space above processing tools is currently unused, in part because a clear, unobstructed path above the I/O ports of the processing tools must be available in conventional systems, the increased storage capacity according to the present invention may be provided without increasing the footprint of conventional tool bays.

33 Claims, 10 Drawing Sheets

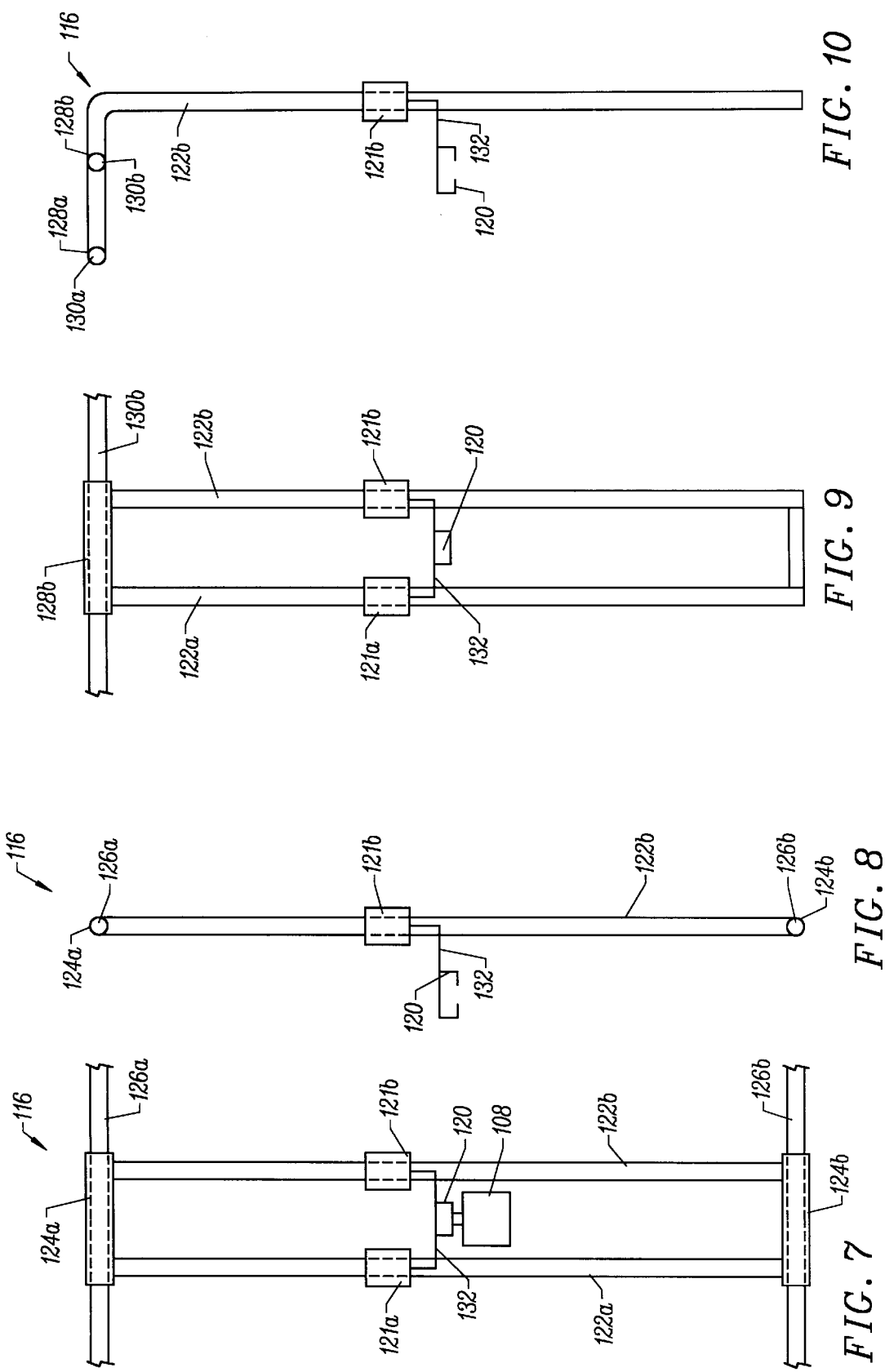

INTEGRATED INTRABAY BUFFER, DELIVERY, AND STOCKER SYSTEM

BACKGROUND OF THE INVENTION

1. Field of the Invention

The present invention relates to the transport and storage of semiconductor wafers, and in particular to an integrated system capable of transferring and stocking wafer-carrying pods between various processing tools within a bay of a semiconductor wafer fab, which system operates with a minimum amount of hardware and software control and in a space efficient manner.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Uhich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.2 $\mu$m and below. In the future, geometries will become smaller and smaller and hence smaller and smaller contamination particles become of interest.

A SMIF system includes a minimum volume, sealed pod used for storing and transporting wafers. Within a wafer fab, a first automated transport system is provided for transferring the SMIF pods from one processing tool bay to another (interbay delivery systems), and a second automated transport system is provided for transferring the pods around within each particular bay (intrabay delivery systems). Each tool bay, typically on the order of about eighty feet long, consists in general of a number of processing tools for performing various wafer fabrication functions, and at least one stocker, where the pods may be stored before or after processing. Additionally, as a pod is generally transferred to several processing tools within a particular bay, the pod may be stored in the stocker between processes. A stocker is typically a large unit having a plurality of shelves on which the pods may be stored, and a transport system for transferring pods into and out of the stocker, and for moving pods around within the stocker.

Some processing tools within a tool bay are typically high throughput tools which are capable of performing their particular wafer process at a relatively higher rate than other processing tools. Additionally, some tools within a bay are metrology tools, which in general monitor or test a single wafer from within a pod of wafers. A pod may store, for example, 25 wafers. If a normal throughput tool can process 50 wafers in an hour, the transport system need only supply 2 pods per hour to that tool. However, for metrology tools which can similarly process 50 wafers in an hour, but only use one wafer per pod, 50 pods must be provided to the metrology tool in an hour to keep the tool from sitting idle.

In order to accommodate high throughput and metrology tools, it is known to include a local tool buffer adjacent the tool port of high throughput and metrology tools, so that pods may be stored locally adjacent such tools and quickly transferred to these tools without having to constantly retrieve a pod from the remotely located stocker. Such local tool buffers are generally configured adjacent the high throughput and metrology tools, and include shelves for storing pods, and a transport system for transferring pods to, from, and within the local tool buffer.

FIGS. 1 and 2 are schematic top and front views, respectively, of a typical tool bay including a stocker 20, and a plurality of processing tools 22 and 40. Additionally, FIGS. 1 and 2 show an interbay delivery system 25 for automated transfer of pods between tool bays, and an intrabay delivery system, explained hereinafter, for automated transfer of pods within a bay. Conventional intrabay delivery systems include a large number of transport interfaces where pods must be handed off, or transferred, from one transport mechanism to another. The transport interfaces within a conventional tool bay will now be explained with reference to FIGS. 1 and 2, and the flow chart shown in FIG. 3. Although shown schematically in the drawings, each interface requires mechanisms for removing or disengaging a pod from a first transport mechanism, and positioning it for engagement with a second transport mechanism. When a pod is first received within a tool bay from the interbay delivery system 25, the pod may either be transferred to the stocker 20 in a step 50, or the pod may be delivered directly to the intrabay transport 30 in a step 52.

Where a pod is first to be stored in the stocker 20, the pod is handed off from the intrabay delivery system 25 to a stocker input/output (I/O) 23 at an interface 27. The stocker I/O 23 in turn hands off the pod to a stocker transport 26 within the stocker at an interface 29 (step 54). Thereafter, a pod may be transferred from the stocker to the tool bay (as explained hereinafter) or back to the interbay delivery system. Where a pod is to be transferred from the stocker back to the interbay delivery system, the pod is transferred from the transport 26 to the stocker I/O 23 in a step 55, and from the stocker I/O, the pod is then transferred to the interbay delivery system 25 in a step 59.

As indicated, the pod may alternatively be transferred directly from the interbay delivery system 25 to the intrabay transport 30 at a mechanical interface 32 in a step 52. From the intrabay transport 30, a pod may be transferred to a plurality of process tools 22, 40, or to the stocker 20 (either before or after transfer to the process tools 22, 40). In order to transfer a pod from the intrabay transport 30 to the stocker, the pod is first transferred to a stocker I/O 21 at an interface 24 in a step 57, and then to the stocker transport 26 at an interface 28 in a step 61. The stocker I/O 21 receiving a pod from the intrabay transport 30 is similar to the stocker I/O 23 receiving a pod from the interbay delivery system, and the stocker transport 26 is capable of receiving pods from both stocker I/O 21 and stocker I/O 23.

Where a pod is to be transferred from the intrabay transport 30 to a processing tool, the pod is transferred to a tool delivery mechanism 34 at an interface 38 (step 60). Alternatively, for the high throughput and metrology tools, such as tools 40, the pod may be transferred in a step 62 first to a local buffer delivery mechanism 42 at an interface 44, and next to an intratool delivery mechanism 46 at an interface 48. The delivery mechanism 46 then positions the pod at a desired location within the local tool buffer. Finally, either the tool delivery mechanism 34 (for normal throughput process tools) delivers the pod to the I/O ports 50 for each tool in a step 63, or the local buffer delivery mechanism 42 (for a high throughput or metrology tool) delivers the pod to the I/O ports 50 in a step 65.

It is further understood that the delivery mechanisms and interfaces as described above are also utilized to return a pod back to the intrabay transport mechanism 30, in steps 64 and 66 for normal throughput process tools, or in steps 68 and 70 for high throughput/metrology tools. The intrabay transport mechanism may then transfer the pods to the stocker, as explained above, or back to the interbay delivery system in a step 67.

As each tool bay may include on the order of approximately 15 to 20 process tools, the overall intrabay delivery system may include over 100 interfaces where a pod must be physically transferred from one transport system to another. Such conventional systems, including large numbers of components and complex hardware, have several disadvantages. First, stockers and/or local tool buffers are expensive, possibly as expensive as the process tools they serve. Also the stockers, local tool buffers, and dedicated transport mechanisms and interfaces take up valuable space within the tool bay. Second, where each tool has a dedicated transport as the sole mechanism for transferring pods to and from that tool, in the event of a transport malfunction, that tool becomes isolated, with no way to feed pods to the tool and no way to remove pods from the tool, other than by manual transfer. Third, each interface where a pod must be handed off from one transport mechanism to another presents a potential danger that a pod will be mishandled during the transfer. The large number of interfaces in conventional systems magnifies the potential for pod mishandling.

In addition to the hardware difficulties presented in conventional delivery and storage systems, the prior art has several disadvantages with respect to the software control of the system. First, each moving and interacting component requires some level of software control. Thus, the many transport mechanisms around the bay, the transport system within the stockers, and the transport systems within the local tool buffers each require software routines for their operation and interaction, resulting in a complex software control system. Second, the software control system must control an interface such that, when a transport mechanism on one side of the interface presents a pod for transfer, the transport mechanism on the other side of the interface must be there to receive it. As explained above, there may be over 100 interfaces within a bay, and an extremely complicated algorithm is necessary to ensure proper timing of a handoff at each interface to avoid either the transferring or receiving mechanism having to wait at an interface. Third, in the event a tool malfunctions, the software control must reroute pods that were scheduled for that tool, remove any pods resident in a local tool buffer for that tool, and find another tool, buffer, or storage location for the pods removed from the tool's local buffer, all without disrupting transfer of pods to and from the other process tools within the bay. Conventional software control programs have extreme difficulty in effectively handling this situation.

As an alternative to the intrabay delivery system shown in FIGS. 1 and 2, it is known to replace intrabay transport 30 with an overhead transport system including a monorail cable hoist. Such overhead transport systems are capable of transporting a pod horizontally along the length of the tool bay, and, when positioned over a desired I/O port 50, cables lower the pod from the transport onto the I/O port 50. Such a system allows the omission of interfaces 38 and 44 shown in FIGS. 1 and 2. However, a problem with such overhead transport systems, as well as a further disadvantage to the conventional system shown in FIGS. 1 and 2, is that there must be a clear, unobstructed path above the I/O ports 50 so that the tool delivery mechanism 34 (in FIGS. 1 and 2) or the cable lift of the overhead transport system may lower a pod onto the I/O port. A further disadvantage to overhead transport systems is that it is important to position the pods in a precise position and orientation on the I/O ports 50, so that the wafers may thereafter be automatedly drawn into the process tools. However, while lowering a pod, cables are susceptible to swaying and have no lateral positioning support other than the force of gravity. Thus, cable systems are prone to error in positioning a pod in the correct position on top of the process tool I/O port.

SUMMARY OF THE INVENTION

It is therefore an advantage of the present invention to provide an extremely simple and efficient system of transferring pods to and from processing tools.

It is another advantage of the present invention to provide a system for delivering pods from an interbay delivery system to a processing tool with minimal pod hand-off and transfer interfaces.

It is another advantage of the present invention to provide a pod storage and delivery system requiring an uncomplicated material control software system, capable of operating in the event of a tool backup or failure.

It is another advantage of the present invention to eliminate conventional stockers and local tool buffers, thereby creating additional space within a tool processing bay, simplifying the hardware and software control systems, and eliminating the costs associated with those units.

It is a further advantage of the present invention to provide a large number of buffering and storage spaces within a tool bay.

It is a still further advantage of the present invention to provide buffering and storage locations in unused space currently available in conventional tool bays so as to provide increased storage and buffering space without increasing the size of a tool bay.

It is another advantage of the present invention that the buffering and storage spaces may be located adjacent to each processing tool within a tool bay so as to increase delivery speeds of pods to a particular process tool.

It is a still further advantage of the present invention to provide a high degree of flexibility with respect to the design and refitting of a tool bay.

These and other advantages are accomplished by the present invention which in a preferred embodiment relates to an integrated intrabay buffer, delivery, and stocker system. In an embodiment of the present invention, each side of each bay in a wafer fab preferably includes a pair of shuttles capable, by themselves, of transferring a pod between the interbay transport system, the I/O ports of various process tools, and storage shelves within the tool bay. Each shuttle preferably includes a gripper translationally mounted within a track unit so that the gripper may translate up and down within the tool bay. Additionally, the track unit itself is translationally mounted for horizontal movement along the tool bay. As such, the gripper of each shuttle is capable of X–Z translation within a vertical plane of the tool bay. The provision of two such shuttles allows a pod to be lifted off of, for example, an I/O port, and another pod immediately placed thereon without having to wait for the first pod to be set down elsewhere.

The present invention further includes a plurality of storage shelves mounted on modular panels which may be mounted along the length of the tool bay in front of the tools and above the I/O ports. Advantageously, the storage shelves may be provided above some or all of the process tools within the tool bay. Such an arrangement offers a substantially greater number of spaces to store a pod as compared to conventional tool bays. Moreover, as the space above processing tools is currently unused, in part because a clear, unobstructed path above the I/O ports of the processing tools must be available in conventional systems, the increased storage capacity according to the present invention may be provided without increasing the footprint of conventional tool bays.

In operation, one of the shuttles retrieves a pod from the interbay delivery system, and then delivers it either to the I/O port of a particular processing tool, or stores it on an available shelf, preferably adjacent to the processing tool to which the pod is to be subsequently transferred. Thereafter, the pod may be moved around within the tool bay by either shuttle until processing of the wafers within the pod is complete for that bay, whereupon the pod may either be stored on one of the shelves, or returned to the interbay transport system.

The present invention provides greater flexibility as compared to prior art systems with respect to bay design and refit. First, the shuttles do not require dedicated paths along which they must travel to deliver a pod to an I/O port, and the delivery system according to the present invention is not dependent on the position of the I/O ports. Thus, for example, there is no need to modify the shuttle if a process tool is replaced by another tool having its I/O ports in a different location than the replaced tool. Similarly, the positions of the storage shelves are not dependent on the positions of the I/O ports. As the shuttle is capable of moving a pod between any two points on a side of the tool bay, there is no need to maintain a clear, unobstructed path above the tool I/O ports.

Advantageously, the present invention integrates together the process tools within a tool bay by providing a single transport mechanism shared by each tool, and by providing a single, large storage and buffer area for pods to be shared by each tool. The present invention further provides a more reliable pod buffer, delivery, and storage system, in that much of the complicated hardware and software control associated with the pod hand-off, the stocker and the local tool buffer of the prior art have been eliminated from the present invention.

BRIEF DESCRIPTION OF THE DRAWINGS

The invention will now be described with reference to the drawings, in which:

FIG. 7 is a front view of a shuttle according to the present invention;

FIG. 8 is a side view of the shuttle shown in FIG. 7;

FIG. 9 is a front view of a shuttle according to an alternative embodiment of the present invention;

FIG. 10 is a side view of the shuttle shown in the alternative embodiment of FIG. 9;

DETAILED DESCRIPTION

The present invention will now be described with reference to FIGS. 4–13, which in general relate to an integrated intrabay system for buffering, delivering, and stocking SMIF pods within a process tool bay. While the preferred embodiment of the invention may operate with SMIF pods, it is understood that the type of pod utilized is not critical to the present invention, and any of various containers in which semiconductor wafers are housed may operate with the present invention. This includes, but is not limited to, bottom opening pods, front opening pods, cassetteless pods, and open cassettes in which the wafers are seated. Additionally, it is contemplated that workpieces other than semiconductor wafers may be provided within the pods, including reticles, flat panel displays, and other substrates which may be stored and/or transported within pods.

Figure 4:
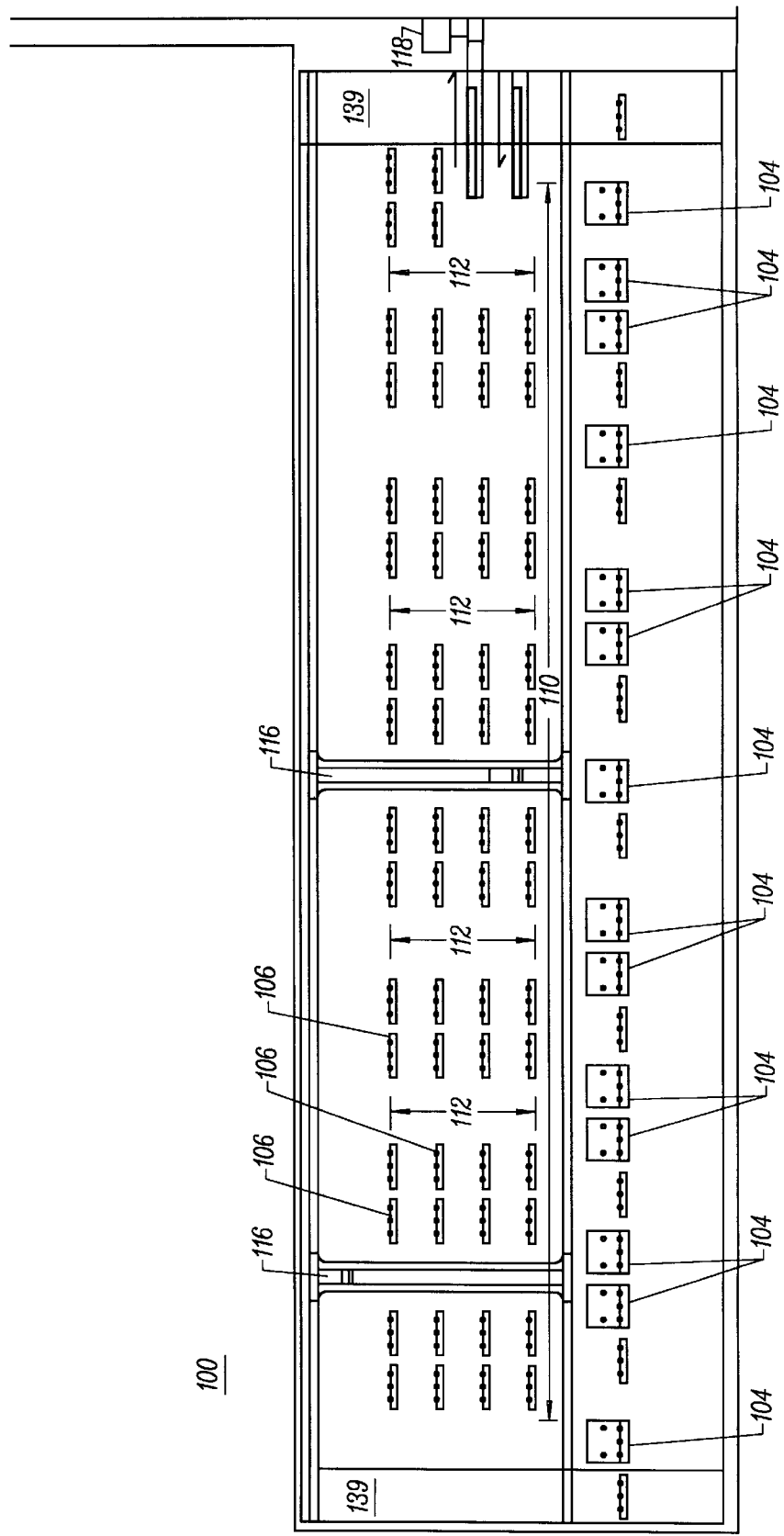
FIG. 4 is a front view of a tool bay including the intrabay buffer, delivery, and stocker system according to the present invention.
Figure 5:
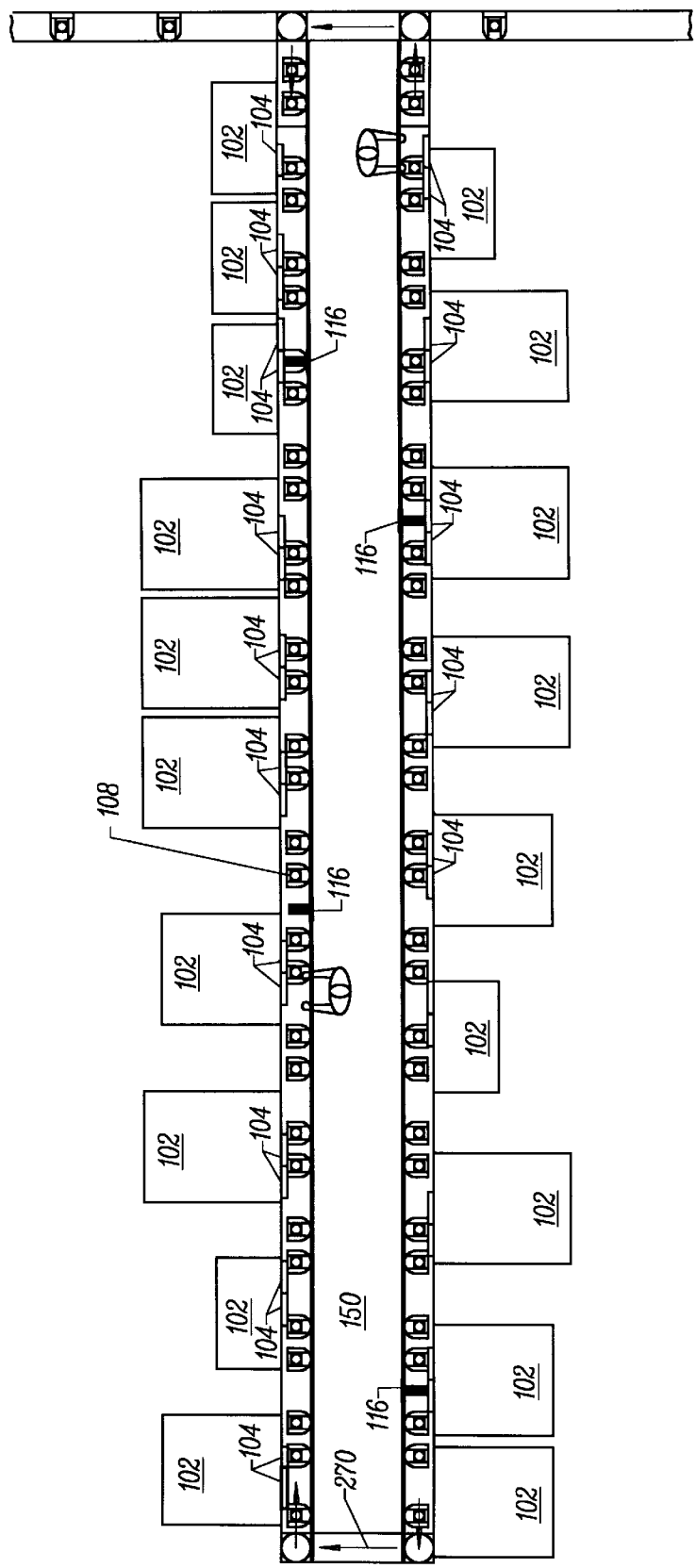
FIG. 5 is a top view of a tool bay including the intrabay buffer, delivery, and stocker system according to the present invention.

FIGS. 4 and 5 show a front view of one side and a top view, respectively, of a semiconductor process tool bay 100. The bay 100 includes a plurality of process tools 102. It is understood that the present invention may operate with any number of process tools within a particular tool bay. Each process tool 102 includes at least one I/O port 104 for accepting a SMIF pod and for transferring wafers between the pod and the interior of the process tool. As is known in the art, the process tools 102 are primarily located in a space, referred to as the chase, behind the bay 100, with a front surface of the tool including the I/O ports 104 protruding into the bay 100. The chase is used to remove and replace process tools and/or to otherwise gain access to the process tools.

Figure 6:
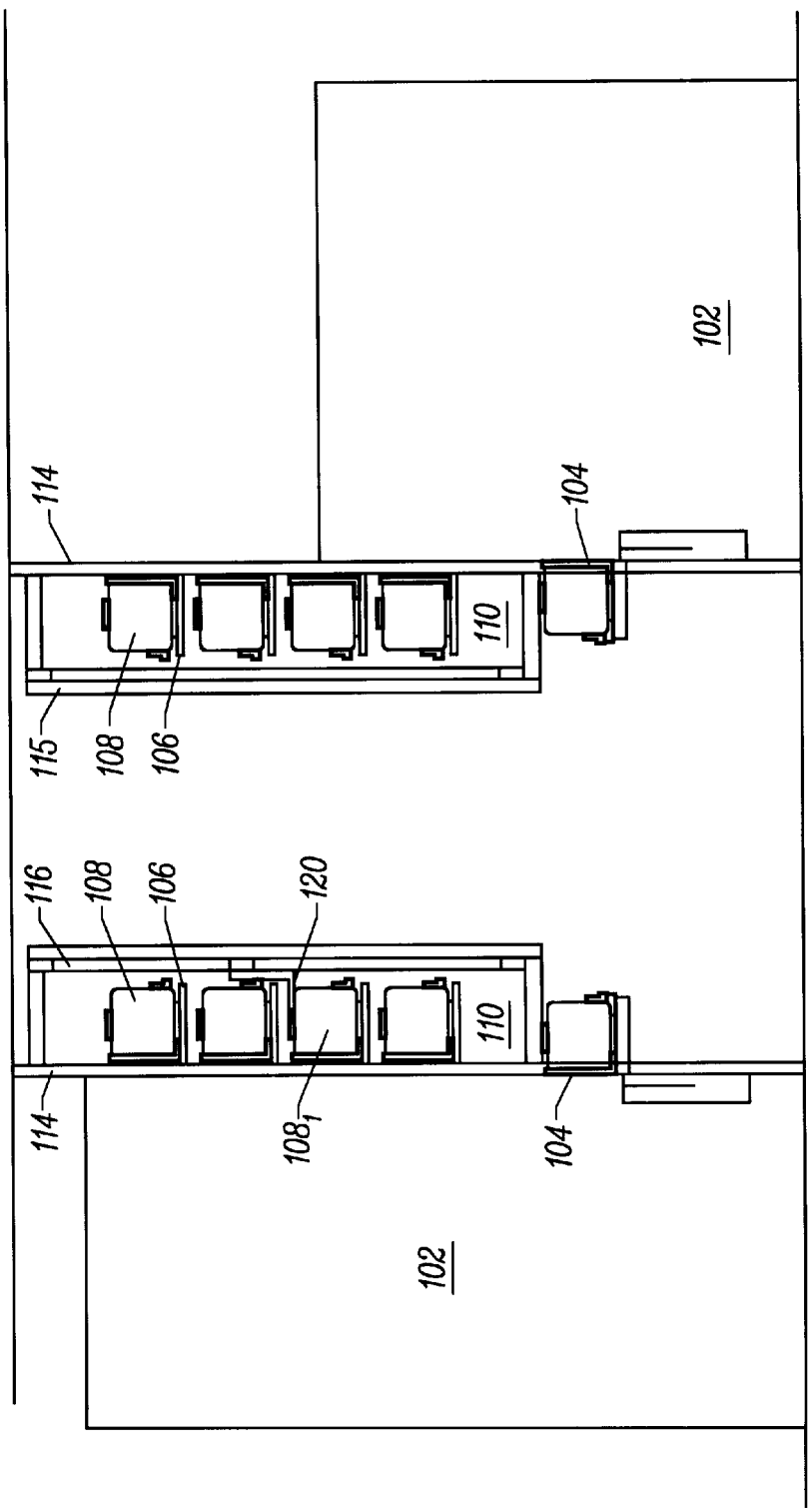
FIG. 6 is an end view of a tool bay including the intrabay buffer, delivery, and stocker system according to the present invention.

As shown in FIGS. 4–6, the bay 100 further includes a plurality of shelves 106, each shelf having an upper surface capable of supporting a pod 108. Shelves 106 may be vertically spaced from each other a distance sufficient to support a pod thereon, and to allow a gripper to enter into the space between the top of the pod and the next upper shelf, to grip and transport the pod as explained hereinafter. As shown in FIG. 4, in one embodiment of the invention, the shelves are aligned in a plurality of rows and columns. It is however understood that the shelves according to the present invention may be provided in various configurations within the bay. In a preferred embodiment of the invention, a space 110 (FIGS. 4 and 6) is provided above or below the rows of shelves 106, or provided between a pair of rows of shelves 106. It is within this space that the pods 108 are transferred horizontally along the bay by the shuttles 116 (explained hereinafter). In addition to horizontal space 110, the shelves 106 are preferably grouped so as to also define vertical spaces 112. Spaces 112 are provided to allow the pods to be vertically transferred by the shuttles within the bay 100 and to allow access by the shuttles to each pod within the bay. In the embodiment shown in FIG. 4, one horizontal space 110 is shown and every third column of shelves 106 is left open to define the spaces 112. However, it is understood that the location and number of spaces 110 and 112 defined by the grouping of shelves 106 may vary in alternative embodiments.

Each shelf 106 is preferably formed of a rigid material having low particulating and outgassing properties, such as for example aluminum with an anodized surface finish. Additionally, as would be appreciated by those skilled in the art, each shelf may include autokinematic mounting pins on its upper surface for mating with grooves on the lower surface of each pod to position and hold the pods on the shelves.

The shelves 106 may be mounted on one or more panels 114 (FIG. 6), which panels may be mounted in modular sections within the bay 100. The panels may be supported on legs mounted to the floor and braced against the ceiling of the bay. Alternatively, the panels may be entirely mounted to the ceiling of the bay. In conventional wafer fabs, cleanroom walls are cut and formed around each process tool to thereby define a cleanroom environment within a tool bay. A consequence of this is that each time a tool is removed and replaced by a new tool of different dimensions, the cleanroom walls, which are expensive, must be discarded, and new cleanroom walls must be cut to the outline of the new tool and installed. However, according to the present invention, this practice may be largely avoided by the use of panels 114. The panels are mounted in a tool bay from the ceiling and down to a height of approximately 1500 mm, slightly above the tool I/O ports. Below 1500 mm, the process tools themselves, together with cut-out cleanroom sections between the tools, seal the bay. Therefore, when a tool is replaced, only the width of the cleanroom sections between the tools and below 1500 mm potentially need be modified (as opposed to having to completely change a 12–15 foot high section of wall as in conventional bays).

The shelves 106 are advantageously provided within the bay above the I/O ports 104. As explained in the Background of the Invention section, in conventional systems, the space above the I/O ports had to be left open in order to provide a clear, unobstructed path for the tool delivery mechanism to lower the pods down onto the I/O ports. However, as explained hereinafter, the shuttle according to the present invention is capable of X–Z translation. The advantage realized with such a system is that a pod may be obtained by the shuttle from a storage shelf, and moved horizontally and/or vertically as needed to position the pod on the desired I/O port. There is no particular path, above the I/O ports or otherwise, which must be utilized by the shuttle in order for the shuttle to be able to transfer a pod onto a particular I/O port. The effect of this is that the shelves may be positioned within the tool bay independently of and without regard to the position of the I/O ports.

The X–Z translation of the shuttle and independent positioning of the storage shelves provide several advantages. First, the flexibility of design and refit of the tool bay is greatly increased. As discussed above, the position of the storage shelves is not determined by the position of the I/O ports. Thus, for example, the panels 114 with shelves 106 may be fabricated even before the layout of the process tools within a bay is known. Moreover, the location of the I/O ports may be changed, as when a process tool is replaced, without having to change the location of the storage shelves.

Figure 1:
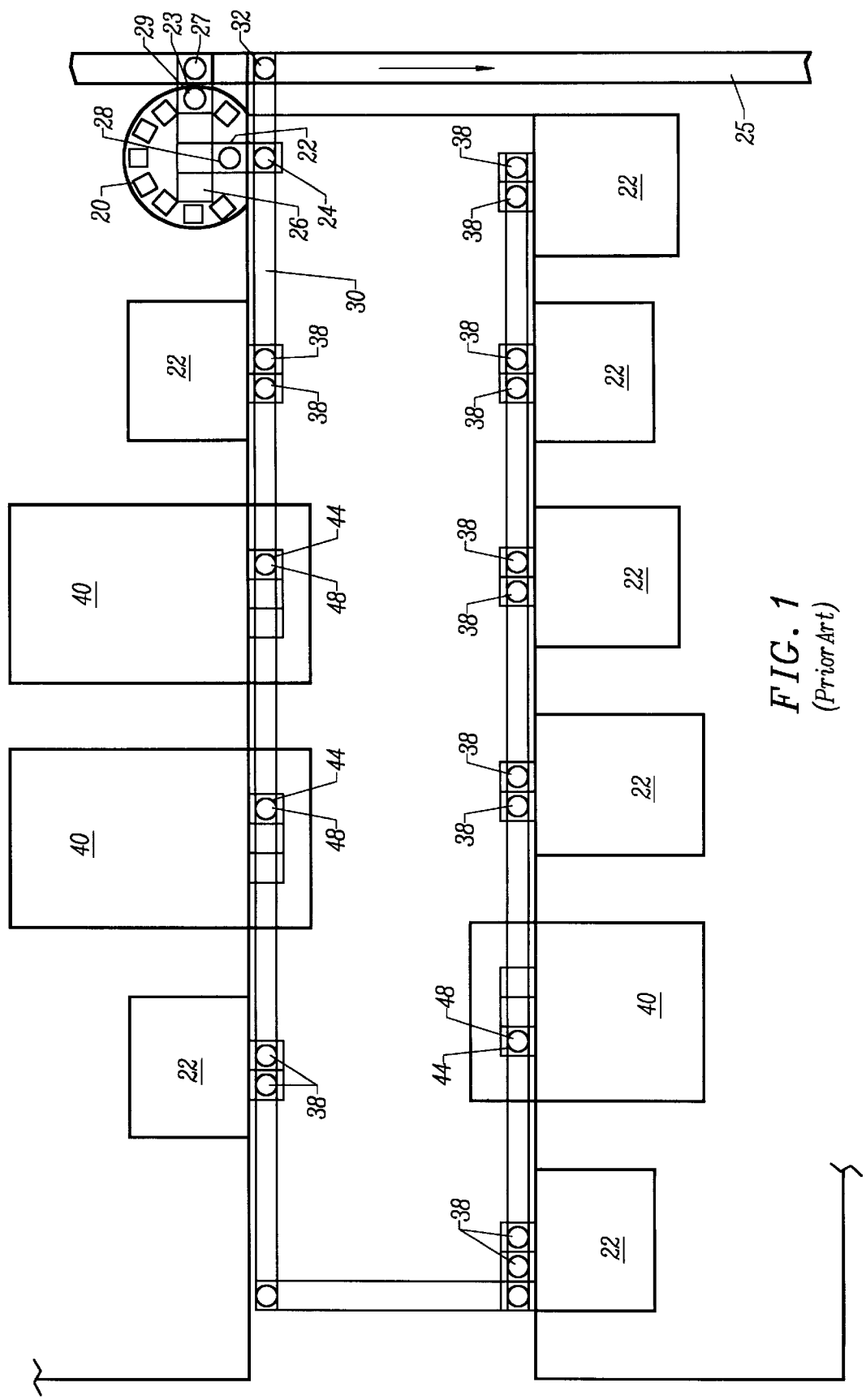
FIG. 1 is a top view of a conventional tool bay including a stocker, a plurality of process tools and a pod delivery system.
Figure 2:
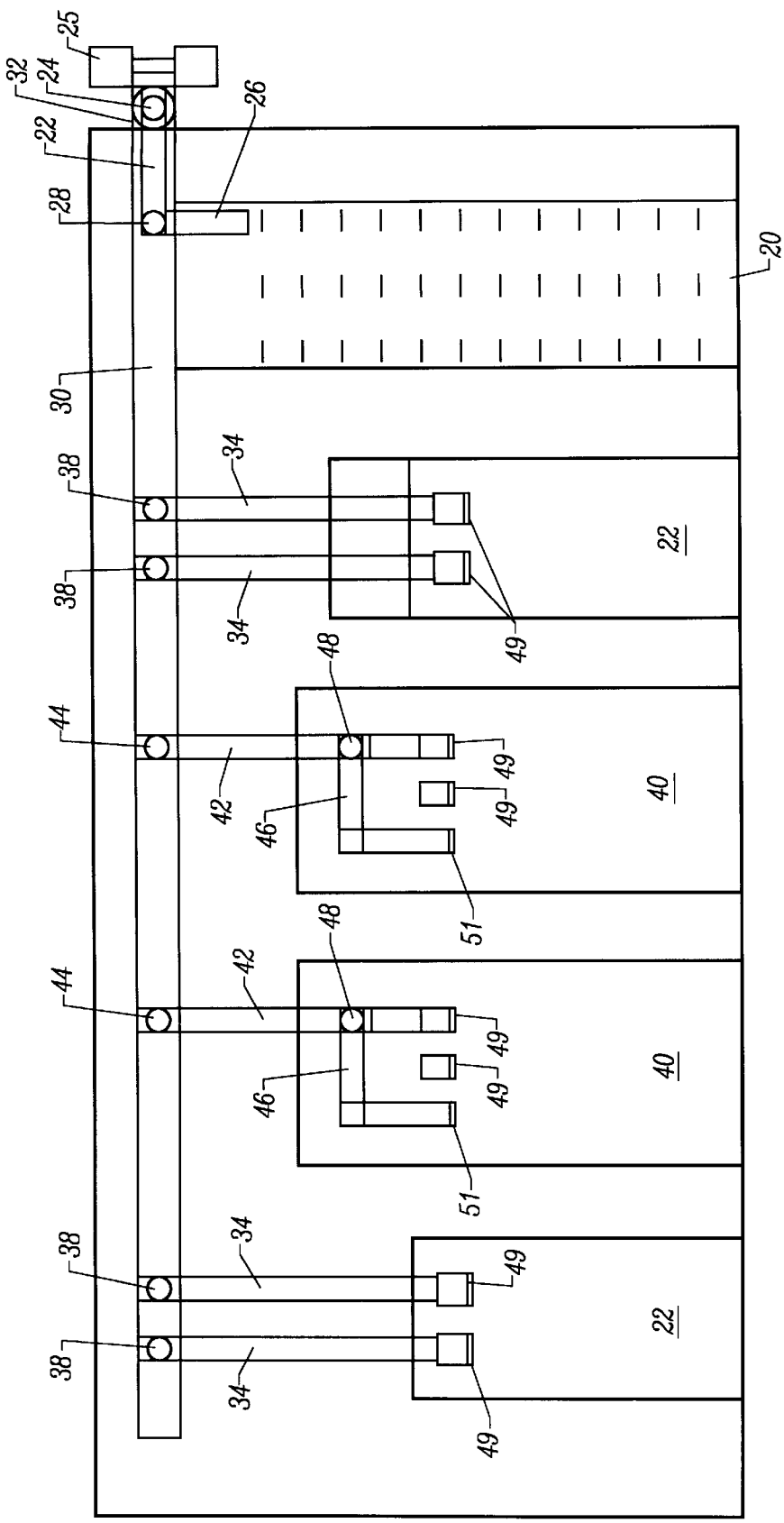
FIG. 2 is a front view of one side of a conventional tool bay including a stocker, a plurality of process tools, and a pod delivery system.
Figure 3:
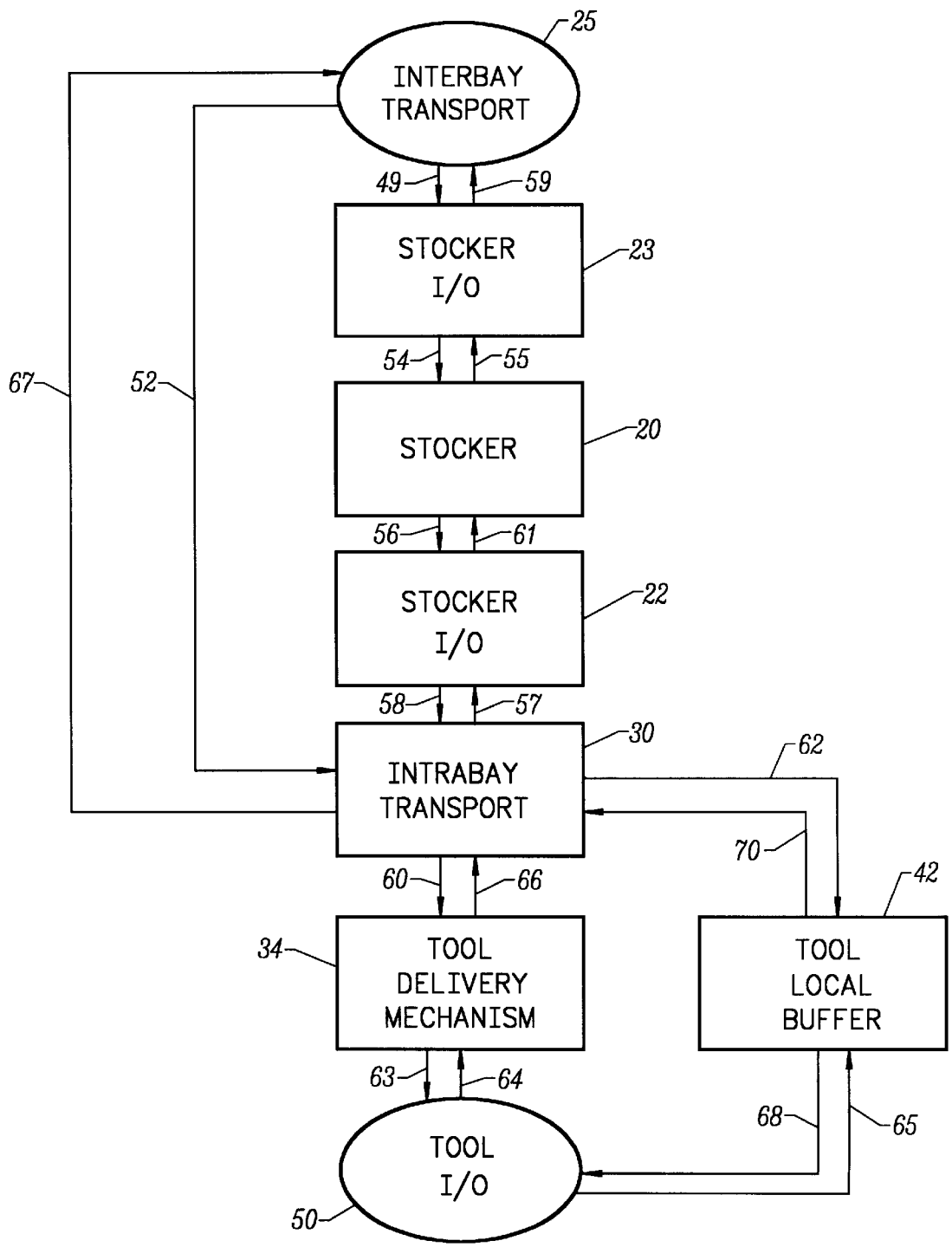
FIG. 3 is a flow chart of the interfaces required in a conventional intrabay pod delivery system.

Replacing the mechanical transfer mechanisms and interfaces with the shuttles of the present invention further improves flexibility. As discussed in the Background of the Invention section with resect to FIGS. 1 and 2, the positioning of, for example, tool delivery mechanisms 34, and interfaces 38 therefor, were entirely determined by the location of the I/O ports; namely, the delivery mechanisms 34 and interfaces 38 had to be located vertically above the I/O ports. A consequence of this is that when a tool is replaced, either the I/O ports of the new machine had to be located in the same position as the I/O ports of the old machine, thereby limiting flexibility, or the existing tool delivery mechanisms and interfaces had to be changed. However, as shuttles 116 do not require dedicated paths along which they must travel to deliver a pod to an I/O port, the delivery system according to the present invention is no longer dependent on the position of the I/O ports.

The buffer, delivery, and storage system according to the present invention also provides greater pod storage capacity relative to prior art systems.

As discussed in the Background of the Invention section, prior art systems used stockers to store pods prior to or after processing within the tools. For tool bays working with 300 mm wafers, conventional stockers held on the average about 100 pods. However, in a tool bay of about 80 feet, which is the same size as conventional tool bays, the present invention may store over twice that amount of pods. Additionally, as the pods in the present invention are stored above the tools, which space was unused in prior art tool bays, the additional storage space is obtained without increasing the footprint of the tool bay. Further, as the pods may be stored on a shelf proximately located to a process tool to which it is to be next transferred, and as the transfer occurs in a single step as opposed to the multiple hand-offs of prior art systems, the present invention is capable of delivering pods to the process tools much more quickly than the prior art systems.

Another advantage provided by the increased storage space according to the present invention is that stockers may be omitted from the system of the present invention. Stockers are expensive, and their omission allows reduction in fab machinery costs. Also, the material control software system (explained hereinafter) may be simplified in that separate controls for operating the stocker may be eliminated. Further still, omission of the stocker frees up valuable space within a tool bay, in which one or more additional process tools may be located, thereby increasing productivity.

In addition to omission of the stocker, because a plurality of shelves 106 may be located adjacent the I/O ports of each process tool, the local tool buffers conventionally provided adjacent high throughput and metrology tools may be omitted. In essence, the shelves provide a local buffer for every process tool, high and normal throughput alike. As with the omission of the stocker, omission of local tool buffers provides advantages at least in that the costs associated with providing local tool buffers may be saved, and the material control software may be simplified. Still another advantage of eliminating the stocker and local tool buffers is that the delivery mechanisms and mechanical interfaces associated with these components may also be eliminated, thereby removing potential sources of malfunction and pod mishandling, and further simplifying the software control system.

The present invention also makes it possible to reduce the width of the process tools, due to the omission of the manual loadport conventionally provided on the tools. In addition to the I/O ports, process tools, most typically high throughput process tools, may include an additional location next to the I/O ports commonly referred to as a manual loadport. A manual loadport is merely a shelf or support surface mounted on the process tool to provide a buffer or storage location where a pod may be placed until the pod is ready for transfer onto the tool I/O ports either manually or automatedly. Examples of such manual loadports are shown at 51 in FIG. 2. In addition to requiring dedicated transport mechanisms and interfaces for locating a pod on a manual loadport, the inclusion of a loadport next to the I/O ports increases the overall width of the process tool. The width of a process tool including two I/O ports and a manual loadport is typically about 60 inches for a system using 300 mm wafers.

As discussed above, it is a feature of the present invention to provide a plurality of shelves adjacent each I/O port along the tool bay. As the shelves provide more than enough buffering for each of the process tools, the manual loadport conventionally provided on the process tools may be omitted. Omission of the manual loadport allows the width of the tool to be potentially decreased by approximately 18 inches for a system using 300 mm wafers. Reduction in the width of a process tool frees up valuable space within a cleanroom environment, and potentially allows room for additional processing tools.

The present invention further includes a pair of shuttles 116 for receiving pods from an interbay transport 118, and transporting the pods around within the tool bay. As shown in the front view of FIG. 7 and the side view of FIG. 8, shuttles 116 include a gripper 120 mounted on carriages 121a and 121b. Carriages 121a and 121b are translationally mounted for vertical movement along rails 122a and 122b. Rails 122a and 122b are in turn mounted to a second set of carriages 124a and 124b, which carriages are translationally mounted for horizontal movement along rails 126a and 126b spanning the length of the tool bay 100. As would be appreciated by those skilled in the art, a pair of drive mechanisms (not shown) may be provided, with the first drive mechanism driving gripper 120 and carriages 121a and 121b along rails 122a and 122b, and the second drive mechanism driving carriages 124a and 124b and the components attached thereto along rails 126a and 126b. The drive mechanisms may preferably include a motor, such as for example a servo or stepper motor, for driving the respective carriages. A power transmission mechanism, such as for example a gear assembly, endless chain or cables, may be operatively connected between the motor and respective carriages to transit the motor power to the carriages. The drive mechanisms are preferably controlled by the material control software described hereinafter. Power and control signals may be received in the shuttles 116 by various known methods, such as for example electrical leads mounted along either horizontal rail 126a or 126b, and along either vertical rail 122a or 122b.

As would be appreciated by those of skill in the art, various other locomotion and translation systems may be substituted for that shown in FIGS. 7 and 8 for accomplishing horizontal and vertical translation of gripper 120. One of many alternative embodiments is shown in FIGS. 9 and 10, wherein the rails 122a and 122b are mounted to a pair of carriages 128a and 128b which ride on a pair of rails 130a and 130b mounted along a top portion of the tool bay. Various other known locomotion systems may alternatively be used. This may include systems which lay down a first translation mechanism over a second, orthogonally moving translation mechanism, or systems having a single mechanism capable of X–Z translation.

Figure 11:
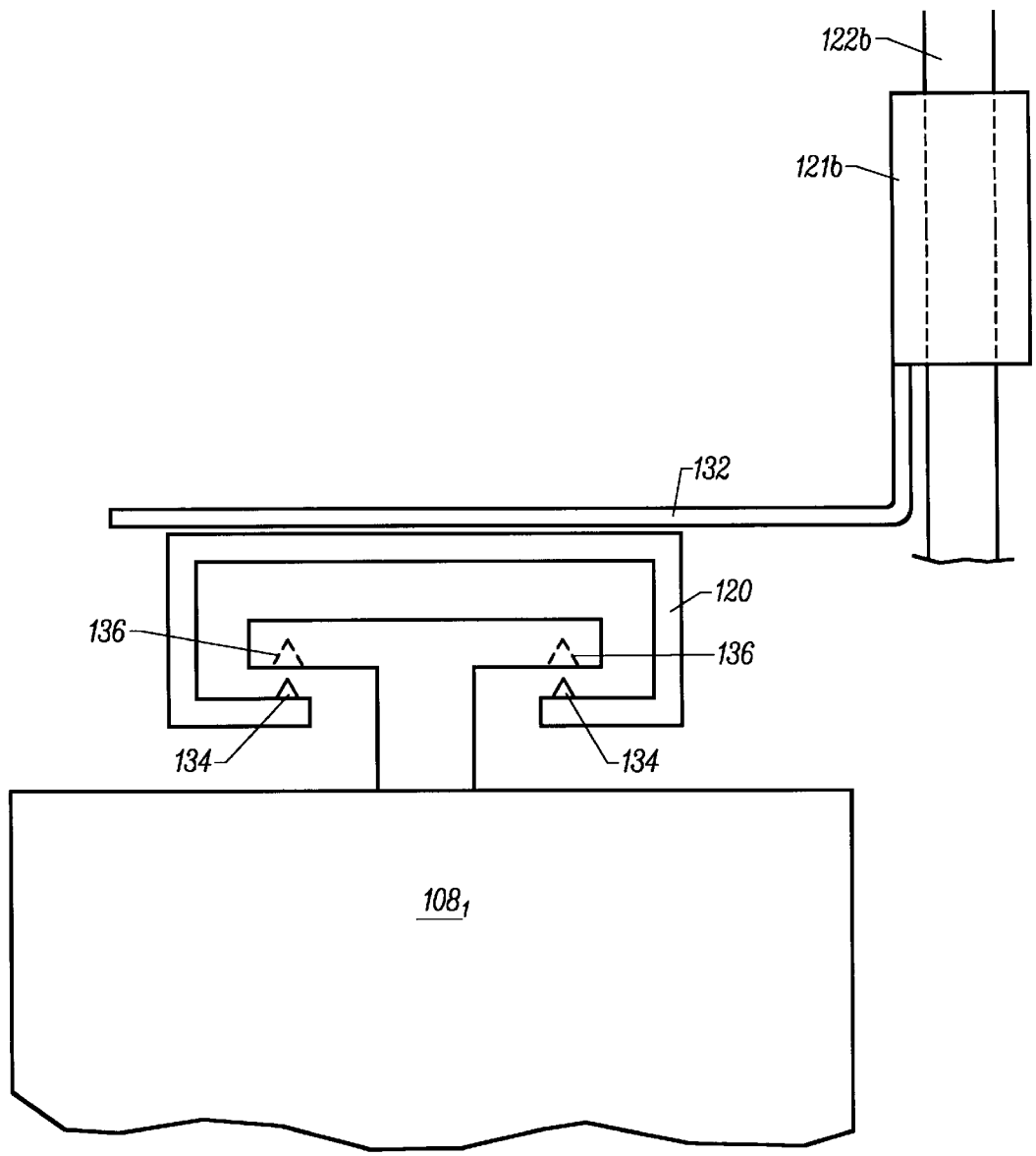
FIG. 11 is an enlarged side view of a gripping mechanism according to the present invention.

Details relating to the gripper 120 are shown in the side view of FIG. 11. A bracket 132 extends between carriages 121a and 121b. The gripper is mounted to the bracket, and includes pins 134 protruding upward from end sections of the gripper. When viewed from the direction of horizontal translation of the shuttles 116, the gripper 120 includes a substantially "C"-shaped cross section. With such a shape, the gripper is capable of moving horizontally over and around a handle 138 conventionally provided on pods 108. The handle includes detents 136 for mating with the pins 134.

Referring now to FIGS. 4, 6, 7 and 11, in order to grip and transfer a particular pod, such as for example pod 108, in FIG. 6, the shuttle is moved horizontally along the bay, and then vertically up or down within one of the spaces 112 until the gripper 120 is located next to the pod $108_1$. The gripper 120 is positioned next to the pod 108, at an elevation such that the shuttle may next be moved horizontally so that the "C"-shaped gripper moves over and around the handle 138, until the pins 134 are substantially vertically aligned with the detents 136. In this position, there is still preferably no contact between the gripper 120 and the pod $108_1$. In a next step, carriages 121a and 121b move upward on rails 122a and 122b so that the pins 134 engage within detents 136, and respective surfaces of the gripper and handle lie in contact with each other. Continued upward movement of carriages 121a and 121b along rails 122a and 122b will lift pod $108_1$ off of its shelf 106 or I/O port 104, and the pod may thereafter be transferred as desired, securely held by gripper 120.

As is known in the art, the shuttle may include sensors (not shown), occasionally referred to as squat sensors, for preventing a shuttle from setting down a pod on a shelf or I/O port already having a pod thereon. Although various known configurations are possible, in one embodiment, the squat sensor is mounted on the gripper 120 to sense the positional relationship between the gripper and a handle 138. If the handle begins to separate from its engagement with gripper 120 prior to a time when a pod is supposed to separate from the gripper, as for example if one pod were being set down on a shelf already having a pod, the sensor is able to detect this initial separation. Thereafter, the controller is alerted as to the potential problem and motion of the shuttle ceases.

Upon location of the pod at its next shelf, I/O port, or at the interbay delivery system, carriages 121a and 121b lower the gripper 120 and pod until the pod rests on the support surface. Continued downward motion of carriages 121a and 121b disengage pins 134 from detents 136, to thereby disengage the gripper from the pod handle. Thereafter, the shuttle translates horizontally until the gripper is no longer vertically aligned around the handle 138, and is once again free to translate vertically without contacting the handle or pod.

The shuttle and gripper operate in substantially the same way to receive a pod from the interbay delivery system. The interface between the interbay and intrabay delivery systems according to the present invention may be that used in conventional bays. Such interfaces include for example various conveyors which receive a pod from the interbay delivery system, supported from the bottom or sides of the pods. With a pod located on the interface between the inter- and intra- bay delivery systems, the shuttle positions the gripper around the handle 138 of the pod, and thereafter raises up to grip the pod as described above.

As would be appreciated by those of skill in the art, various other known mechanisms may be used instead of gripper 120 to engage, transfer, and disengage pods 108. For example, while the system disclosed above is a passive gripper (in that the gripper itself is of a fixed construction), an active gripper may be used which includes jaws capable of closing and opening, to thereby grip and release, respectively, the pod. Moreover, it is understood that the structure and operation of the various gripping mechanisms may vary depending on the configuration of the pod to be gripped and transferred.

When gripper 120 of shuttle 116 is carrying a pod, the gripper must be positioned within space 110 in order to move horizontally along the tool bay. However, when shuttle 116 is not carrying a pod, the shuttle may move horizontally with the gripper at the elevation of the pod handles within any given horizontal row. At this elevation, as the shuttle moves horizontally, the gripper 120 passes around the pod handles without contacting the pod handles or pod.

Various systems may be used to identify the position of a shuttle gripper as the gripper moves within the bay, thus allowing the gripper to be positioned at a desired location within the bay relative to a pod on a shelf or I/O port. In order to identify the horizontal position of the gripper, one or both of the horizontal rails 126a, 126b may include indicial marks which are read by sensors on the shuttles as the shuttles pass thereover, so that the shuttles know their horizontal position within the bay. Such indicial marks may include, but are not limited to, RF emitters, optical fiducials, and mechanical flags. In order to identify the vertical position of a gripper within the bay, the gripper may include a servo mechanism cooperating with the shuttle driving mechanism for measuring how much the gripper has moved up or down along the vertical rails 122a, 122b. The gripper may initially be referenced at its upper or lowermost position on the rails 122a, 122b, which is at a known elevation within the bay. Thereafter, the servo mechanism can identify and measure the upward and downward movement of the shuttle relative to the reference location. As would be appreciated by those skilled in the art, other known schemes may be used to identify the X–Z position of the grippers within the bay.

As best seen in FIG. 6 and as explained above, the shelves 106 are mounted to the panel 114 and are adjacent to and extend out away from the tools 102. The shuttle 116 is mounted on vertical rails 126a and 126b spaced away from the front of the tools a distance slightly greater than a length of the shelves. Thus, as the shuttles 116 translate along the tool bay, the vertical rails pass in front of the shelves 106 and pods 108, while the gripper 120 extends away from the shuttle 116 into the space of the shelves. Thus, the grippers and shelves share the same depth along the bay wall in the present invention, and the pods are likewise transferred in this same depth. This is in contrast with conventional automated storage and retrieval systems (ASRS) and automated guided vehicles (AGV), in which the entire mechanism must be located in front of the shelves and/or bins storing the articles to be transferred.

In an alternative embodiment of the present invention (not shown), the relative positions of the shelves and shuttles may be switched. In this embodiment, panels 114 may be supported from the ceiling and/or floor, with the shelves 106 mounted thereto and extending in the direction of the tools 102. The shuttles 116 in this embodiment would be positioned adjacent the tools 102, with the gripper 120 extending in the direction of panel 114. In either of the above-described orientations of the shelves and shuttles, a preferred embodiment of the present invention further includes an outer panel 115 for encasing the shelves and shuttles. As explained hereinafter, this barrier prevents contact between the human operators within the bay and the shuttles and shelves of the present invention. The panel 115 extends from the top of the bay down to the lowest elevation of the gripper (approximately 1500 mm). The panel 115 is also preferably formed of clear material, such as for example plexiglass, so that an operator may look through the panel 115 while manually locating a pod on an I/O port, or shelf at that elevation.

Figure 13:
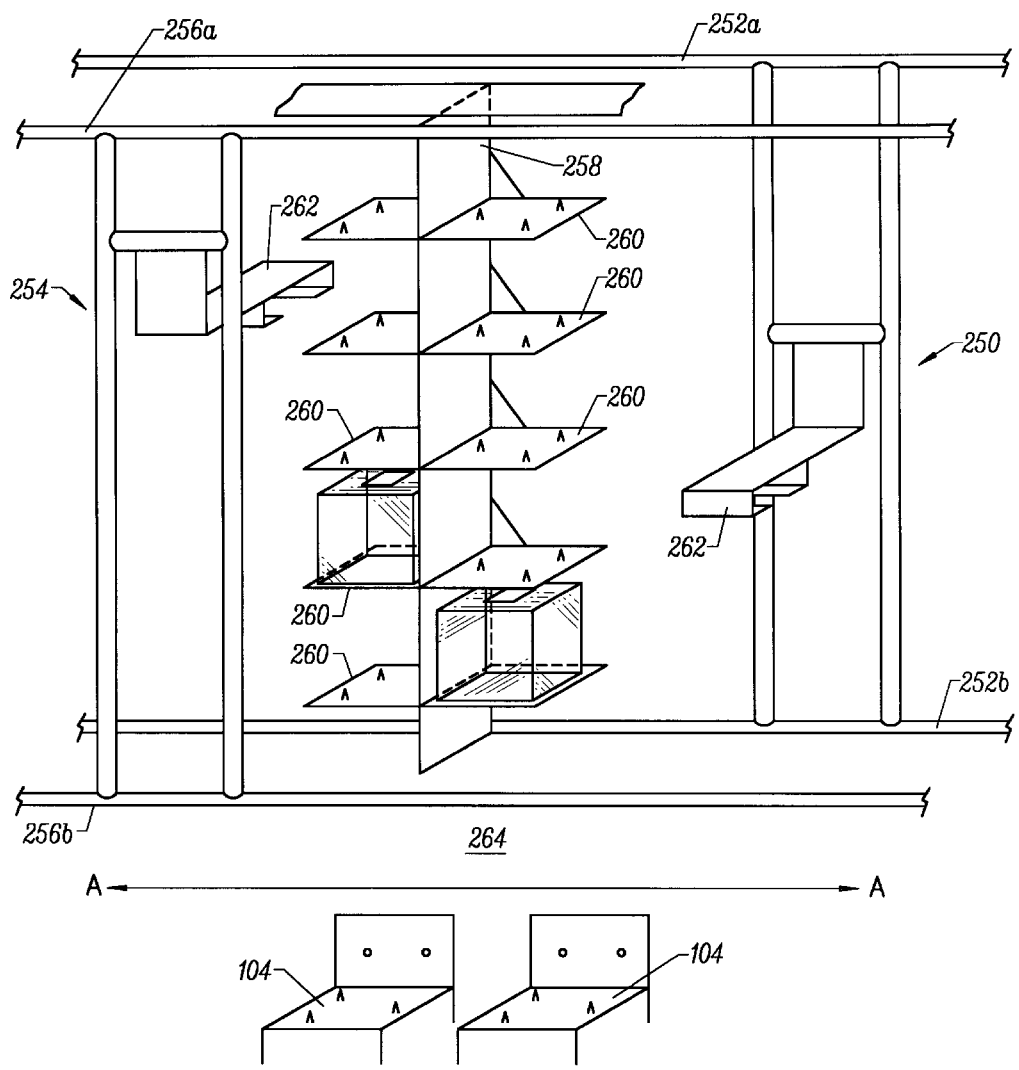
FIG. 13 is a perspective view of the shuttles and storage shelves according to an alternative embodiment of the present invention.

In one embodiment of the invention, the shuttles ride along the same horizontal rails and do not cross each other. However, in an embodiment of the present invention shown in FIG. 13, the shuttles may cross over each other. In this embodiment, a first shuttle 250 rides on rails 252a and 252b adjacent to the bay wall, and a second shuttle 254 rides on rails 256a and 256b spaced away from the bay wall. A column 258 is mounted to and suspends downward from the ceiling of the bay, lying in a plane substantially perpendicular to the bay wall. A plurality of shelves 260 are mounted to the column on either side of the column. The columns may be provided along the bay, spaced horizontally from each other a sufficient distance to allow the shuttles 250, 254 to raise and lower in between horizontally adjacent columns of shelves. The shelves on opposite sides of a column may be aligned with each other, as shown in FIG. 13, or may be staggered with respect to each other. The column of shelves 260 lies between the shuttles 250 and 254. Each of the shuttles 250 and 254 include grippers 262 identical in structure and operation to grippers 120 shown for example in FIG. 11. The grippers of each shuttle 250, 254 extend toward the shelves 260.

In the embodiment of FIG. 13, the shuttles operate to translate vertically and horizontally in an identical manner to the shuttles 116 described with respect to FIGS. 7 and 8. However, the shuttles 250 and 254 advantageously can pass by each other, with one shuttle on one side of the shelves 260 and the second shuttle on the other side of the shelves. In order to translate horizontally along the bay, the shuttles 250, 254 must be positioned in a horizontal space 264 below the shelves 260 and above the I/O ports 104. This space is indicated by arrow A—A in FIG. 13. While at an elevation of the shelves 260, a shuttle is only capable of moving horizontally between adjacent columns to acquire pods of the columns to the immediate left and right of the shuttle. In order for the shuttles to pass each other, the grippers 262 of each shuttle must be positioned within space 264 at different elevations. Moreover, if it is desired to switch the positions of the shuttles 250, 254 while each is carrying a pod 108, the space 264 must have a height equal to slightly greater than twice the height of a gripper and pod.

In transporting pods of any of the above-described embodiments into, out of, and around a tool bay, it is a primary objective of the transport system that the process tools not be left idle. In conventional systems, upon completion of a process on wafers within a particular pod, a port must lift the pod from the tool port, transfer it, obtain a new pod, and set it down on the port. The process tool may sit idle while this pod-switching operation takes place. This occurs each time processing of wafers within a pod is complete, and it occurs for each process tool in the bay.

It is a feature of the present invention to reduce the idle time of the tools by providing first and second shuttles (116 in FIG. 4; 250, 254 in FIG. 13) on each side of tool bay 100. In operation, for each process tool, when a process is finished on wafers within a particular pod, one of the shuttles removes the pod from the I/O port, while the other shuttle locates a new pod on the I/O port. The two shuttles work in tandem so that one shuttle is moving a pod toward an I/O port even before the second shuttle has removed the finished pod from that port. Thus, idle time for each process tool within the bay is minimized. Where a bay includes a large number of high throughput and/or metrology tools, it is understood that more than two shuttles 116 may be provided on one or both sides of the bay. It is further understood that the system of the present invention may operate with only one shuttle 116.

In a preferred embodiment of the invention, each side of tool bay 100 includes shuttle storage spaces 139 (FIG. 4) at opposite ends of the bay 100 for receiving respective ones of the shuttles 116. If one of the shuttles 116 is being serviced or otherwise not in use, it may be located in its respective shuttle storage space 139 and the remaining shuttle or shuttles may continue to transport pods around the tool bay in a normal fashion, without interference from the off-line shuttle.

The shuttles according to the present invention provides an extremely reliable and flexible transport system. For example, in the event a shuttle is replaced, the new shuttle is capable of communicating with the control software without having to reconfigure the control software to operate with the new shuttle. Second, the shuttles are self-calibrating. That is, when a shuttle is first brought on-line, it is capable of determining the vertical and horizontal position of the gripper within the bay. Although this may be accomplished by various methods, in one embodiment, the gripper may be referenced to the known upper or lowermost position in the bay, as explained above, to identify the vertical position of the gripper. Similarly, the shuttle may be passed over one of the indicial marks on the horizontal rails, which may relay the horizontal position of the shuttle to the sensor on the shuttle as explained above. These features increase the reliability and flexibility of the present invention relative to conventional transport systems, in that, if a shuttle malfunctions, it may be moved into a shuttle storage space 139, out of the way of the transport path, and a new shuttle placed on-line. Almost immediately upon being brought on-line, the new shuttle is capable of calibrating its position within the bay, and is capable of communicating with, and receiving control signals from, the control software, without having to reconfigure the control software to work with the new shuttle. Thus, any operation down-time is minimized, and the pod-delivery problems found in the prior art upon transport malfunction are avoided.

Some conventional interbay delivery systems transport pods down one side of the wafer fab and deliver pods to the tool bays from one side of the bay. This type of system is shown for example in prior art FIG. 1 and FIG. 5. For such systems, a conveyor is needed to transport pods from one side of the bay to the other. FIG. 5 further shows a conveyor 270 for this purpose. Conveyor 270 may be a belt, car or other type of known conveyor, capable of receiving a pod from a shuttle on one side of the bay, preferably gripping the pod from its bottom or sides, and transferring the pod to a shuttle on the other side of the bay. Of course, additional interfaces may be provided such that conveyor 270 is a top gripping mechanism. Although the conveyor 270 is shown at the end of bay 100, it is understood that such conveyors may be provided at one or more locations along the length of bay 100 to transfer pods from one side of the bay to the other side. A pod may preferably be transferred back to the interbay transport from either side of the bay. Other wafer fabs have interbay delivery systems extending down both ends of a tool bay so that pods may be transferred to and from the interbay delivery system from either end of the bay. Such configurations may still utilize one or more conveyors 270 to transfer pods from one side of the bay to the other along the length of the bay.

It will be understood that many of the hardware problems of the prior art are alleviated by the delivery, buffer, and storage system of the present invention. First, as previously indicated, the space and expense associated with the stocker and local tool buffer within each bay may be saved. Second, as the tools do not have dedicated delivery mechanisms, the present invention does not have the problem found in the prior art of a tool being cut off from pod delivery and left idle if the transport system dedicated to that tool malfunctions. Third, the number of interfaces where a pod is handed off from one delivery mechanism to another is greatly reduced by the shuttles of the present invention, thereby greatly improving reliability and minimizing potential for pod mishandling. Fourth, each tool in prior art systems is effectively isolated from each other tool, in that each tool has its own dedicated delivery system, and dedicated local tool buffers are provided for each tool requiring them. However, the present invention integrates together each of the process tools within a bay, in that each tool shares a common delivery system, and each tool shares a common storage system.

A further feature of the present invention is that the integrated intrabay buffer, delivery, and storage system is scalable. That is, the height and length of the panels 114 including the shelves 106 may be configured to any desired sizes, depending on the particular dimensional requirements of the semiconductor manufacturer's tool bay. Additionally, as the location of the shelves are not dependent on the tool I/O ports, the panels 114 may be built and installed without knowing the layout of the process tools within the bay. Similarly, the shuttles 116 can work in tool bays of all sizes. Travel of the shuttles around a tool bay is controlled by the material control software, which is easily configured to travel about tool bays of differing dimensions.

Several standards set by Semiconductor Equipment and Materials International ("SEMI") relate to preventing conflicts between the automation within a wafer fab and the human operators within the fab; that is, areas where the automated machinery could potentially injure or otherwise interfere with the human operators. The present invention minimizes the potential for operator/automation conflicts as a result of the shelves and shuttles being located entirely behind panels 115, on the walls of the tool bay 100, out of the way of the operators. The only location where the present invention and an operator may come together in the same space is at the I/O ports themselves. This is in contrast with conventional automated storage and retrieval systems and automated guided vehicles, which systems are difficult and dangerous to use in the presence of human operators due to the large potential for contact between such systems and the human operators.

The invention has thus far been described as a buffer, delivery, and storage system where the shuttles grip a pod from a top of the pod and then set it down on a shelf which supports the pod from its bottom surface. However, in alternative embodiments of the invention, it is understood that the configurations of the shelves and grippers may be reversed. That is, the above-described gripper 120 on the shuttles 116 may be replaced with a horizontal support platform for receiving a pod from the interbay delivery system and supporting the pod from the bottom of the pod. In this embodiment, the above-described shelves may be replaced with a like number of gripping mechanisms similar in configuration to the gripper 120 described above with respect to FIG. 11. In this embodiment, the shuttles receive the pods from the interbay delivery system supported from the bottom, and transfer the pods to the gripping mechanisms provided throughout the bay on the wall of the bay. In this alternative embodiment, the relative interaction of the support platform on the shuttles and gripping mechanisms, for loading and unloading the pods onto the gripping mechanisms, is similar to such interaction of the shelves and gripper of the embodiment shown in FIGS. 4–11. An additional mechanical interface is required for this embodiment for transferring the pod from the support platform of the shuttles onto the I/O ports. Alternatively, operators may manually transfer the pod from the support platforms to the I/O ports.

In a further alternative embodiment, the shuttles may be provided with a gripping mechanism capable of gripping a pod from its sides, and setting it down on a shelf 106 (for the embodiment of FIGS. 4–11), or in the gripping mechanism in the embodiment described in the preceding paragraph. Pods may conventionally include detents on the sides of the pods for receiving such side-gripping mechanisms.

The operation and software control of the integrated intrabay buffer, delivery, and stocker system will now be described with reference to the flowchart shown in FIG. 12. The material control software in general includes a fab-wide scheduling routine and an intrabay scheduling routine. The fab-wide scheduling routine is generally unaffected by the present invention, except to the extent it is simplified in that conventional fab-wide scheduling routines must provide for transfer of a pod to either a stocker of a particular bay or directly to the intrabay transport mechanisms, and must provide decision criteria for selecting one path over the other. The fab-wide scheduling routine for use with the present invention needs only handle transfer of a pod between the interbay delivery system and a shuttle 116 as described above.

The intrabay scheduling routine controls the operation of the transport system according to the present invention with respect to each process tool within bay 100. Each tool within a bay reports to the intrabay scheduling routine to indicate how soon until the process currently underway within that tool will be completed. In this way, the scheduling routine can plan which of the processing tools will be the next to complete its process, to thereby position the shuttles to remove a pod from, and replace a pod on, an I/O port of that tool even before the process of that tool has been completed.

Figure 12:
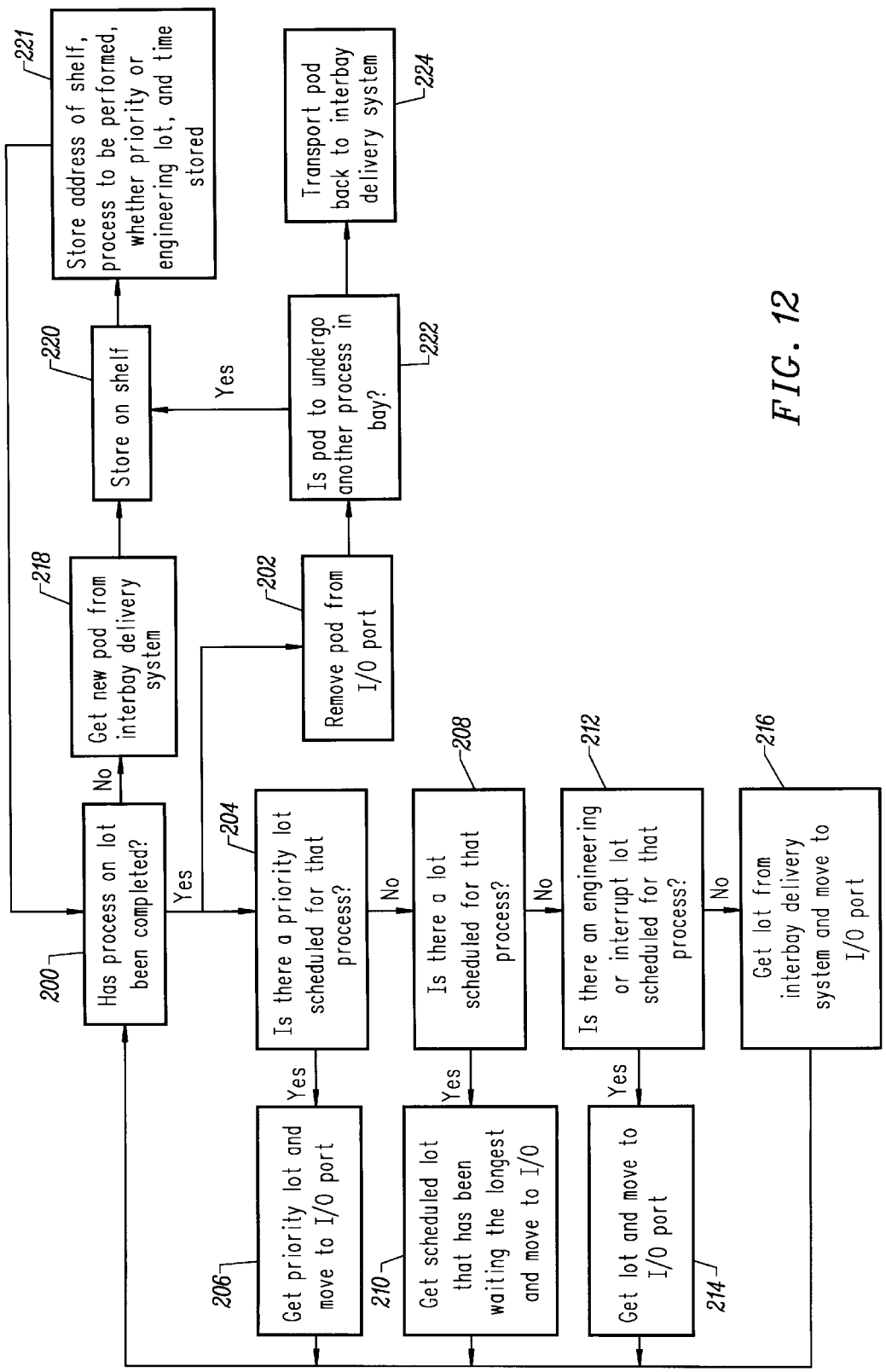
FIG. 12 is a flow chart of a preferred embodiment of the software control for moving pods around within a process tool bay according to the present invention.

Referring to the flow chart of FIG. 12, the scheduling routine determines which tool is the next to complete its process on a group of wafers from a particular pod (commonly referred to as a wafer lot). Where the routine determines a tool is about to complete its process on a wafer lot, the routine moves one shuttle to the I/O port of that tool, so that it may carry the pod away in a step 202 once the processed wafer lot has been returned to that pod. The routine also at the same time moves the second shuttle to retrieve a next pod scheduled for the nearly completed process, and moves the next scheduled pod adjacent the I/O port of that process tool so that it may be located on the I/O port once the first shuttle has carried the completed lot and pod away from the port. The criteria for determining which pod is next scheduled for a particular process tool is explained below.

U.S. Pat. Nos. 5,166,884, 4,974,166, and 5,097,421, assigned to the owner of the present invention, each relate to a so called "SMART tag" system, wherein a wafer lot may be tracked at its various locations around a wafer fab, and may be controlled with respect to which processes are performed on that lot. The above-named three patents are hereby incorporated by reference in their entirety. In particular, each pod includes an electronic tag which stores information identifying the particular wafer lot within the pod, and the particular processes to be performed on the lot. The grippers may include sensors capable of retrieving this information from the SMART tags, and communicating this information to the intrabay scheduling routine. Instead of or in addition to the SMART tag system, a bar code reader or RF receiver may be provided on the shuttle 116, for example on gripper 120. In such embodiments, as the shuttle 116 moves horizontally along a row and/or vertically along a column, the bar code reader reads a bar code, or the RF receiver receives indicial information, provided on each pod in the row and/or column. This information can also be used to track the pods and control which processes are performed on the pods. It is understood that various other schemes may be used for storing information relating to a particular wafer lot, and for retrieving and transferring this information. For example, in an alternative embodiment of the invention, the pods may be devoid of any SMART tag, bar code or other indicial mark. In such embodiments, the identification information regarding a particular lot may be stored directly in the interbay and intrabay scheduling routines, which identify a lot by the known location of the lot at any given time.

In some instances, a wafer lot within a pod is designated as a priority lot. For various reasons, it may be desired to complete the semiconductor processing sequence on a particular lot in a shortened period of time. Accordingly, once it has been determined that an I/O port for a particular process is soon to be available in the step 200, the scheduling routine next checks to see if a priority lot is scheduled for the available process tool in a step 204. If there is, the priority lot is obtained by the second shuttle and loaded onto the process tool when it becomes available, in a step 206. The information indicating the priority nature of a lot may be contained in the pod SMART tag, encoded in the bar code or RF transmitter, or indicated by some other known indicial scheme. The scheduling routine then returns to the step 200 to check for the next available process tool.

If the scheduling routine determines that there is no priority lot, it next checks to see if there is any normal production wafer lot in the bay scheduled for the available tool in a step 208. In a preferred embodiment, the scheduling routine utilizes FIFO logic so that, where more than one normal production lot is scheduled for a particular open process, the program causes the shuttle to select the lot which has been stored in the bay for the longest period of time, and transfers that lot onto the process tool in a step 210. The routine then returns to step 200 and checks for the next available process tool.

On occasion, lots are sent through a process to test various parameters on the wafers and/or within the process tool. These lots are referred to as engineering lots. Alternatively, an operator may want to interrupt the scheduling routine, and manually retrieve a pod for relocation to a particular I/O port or otherwise. If the scheduling routine determines in a step 208 that there are no normal production lots scheduled for the soon to be available process tool, the routine next checks in a step 212 for any engineering or interrupt lots. If there are, those lots are transferred onto the tool, again applying FIFO logic, in a step 214. The information indicating that a lot is an engineering or interrupt lot may be contained in the pod SMART tag, encoded in the bar code or RF transmitter, or indicated by some other known indicial scheme. The routine next returns to step 200 to check for the next available lot. If a process tool is soon to be available, and there are no priority, normal production, or engineering/interrupt lots scheduled for the available process tool in the bay 100, the intrabay scheduling routine operates with the fab-wide scheduling routine to obtain a lot scheduled for the available process tool, and that lot is transferred to the available process tool in a step 216.

As discussed above, it is important that the process tools within bay 100 not be left idle. Therefore, the highest priority for the intrabay scheduling routine in a preferred embodiment is to ensure that pods are quickly removed and replaced on the tools in steps 202–216 upon completion of a process. However, in the event that the scheduling routine determines that there are no process tools which are soon to be available (for example, within the next 1 to 2 minutes), the next order of priority for the intrabay scheduling routine is to bring more pods into the bay 100. Therefore, if the scheduling routine determines in step 200 that there are no soon to be available process tools, the intrabay scheduling routine directs a shuttle 116 to obtain a new pod from the interbay delivery system in step 218, and stores that pod on a shelf 106 in a step 220. The intrabay scheduling routine may use various criteria for selecting a shelf on which to store the pod, such as for example, the nearest available shelf to the process to which a pod is to be next transferred. In a step 221, the scheduling routine also stores information contained in the lot's SMART tag, bar code, or RF transmitter relating to the process or processes to be performed on that lot, whether the lot is a priority or engineering/interrupt lot, the address of the shelf on which the pod is stored, and the time at which the pod is stored. This information is used in the steps 204–212 to determine the priority in which the pods are transferred to available process tools.

It is possible that a lot undergoes only a single process within a particular bay 100. However, on occasion, more than one process is performed on a wafer lot within the same bay. As such, once a lot has been removed from a process tool upon completion of a process thereon, the scheduling routine checks in a step 222 whether that lot is to undergo additional processes within that bay. If there are, the lot is returned to a storage shelf 106 in the step 220, and if there are no additional processes to be performed on that lot in that particular bay, the pod is preferably transferred back to the interbay delivery system in a step 224. Advantageously, the steps 204–216 for moving a pod onto a port occur simultaneously with the steps 202, 222, and 224 for removing a pod from a port and relocating it to either another storage shelf or back to the interbay delivery system. This is accomplished by the two shuttles operating together in tandem.

It will be understood that many of the software control problems of the prior art are alleviated by the delivery, buffer, and storage system of the present invention. First, the software control is greatly simplified relative to prior art systems in that separate controls for the stocker, local tool buffers and multitude of transport mechanisms and interfaces for each tool are unnecessary in the present invention. Second, if a tool malfunctions or goes off-line, the scheduling routine simply removes that tool from the schedule. No sophisticated algorithms are necessary for rerouting or removing pods from local tool buffers. Third, as the multitude of interfaces where one transport mechanism hands off a pod to another transport mechanism have been vastly reduced in the present invention, the problem in the prior art of timing the meeting of the respective transport mechanisms at each interface is greatly simplified.

As would be appreciated by those of skill in the art, the system of operation shown in FIG. 12 and described above is only one of many embodiments for the control of the integrated intrabay buffer, delivery, and storage system according to the present invention. Several other priorities and contingencies may be included in the routine in addition to or instead of the above-described criteria for determining the operation of the system. Additionally, the described system is a pull based system. That is, the algorithm focuses on whether a process tool within the bay is open, and if so, a pod is transferred, or pulled, to the available tool. It is alternatively understood that push based systems may be employed with the present invention. Such systems focus on the wafer lots, and in particular the scheduled process sequence for a wafer lot. Upon completion of one scheduled process, the lot is then transferred, or pushed, to the next scheduled process. This may be performed by the fab-wide scheduling routine.

The shuttles may additionally include various positional sensors (not shown) for sensing positions of the pods as the shuttles travel through the bay. As would be appreciated by those of skill in the art, such sensors may be used to ensure that the pods are properly positioned on the shelves. The sensor system may be any of various sensing systems, such as for example optical block-the-beam or reflective sensors, IR sensors, lasers or video cameras such as a charge coupled display (CCD) camera.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

I claim:

1. A system for storing a plurality of pods within at least a section of a tool bay and for transferring said plurality of pods around within the tool bay, the tool bay including a plurality of process tools, said system comprising:

a plurality of storage locations provided along a wall of the tool bay containing the process tools, at least one first storage location of said plurality of storage locations being at least partially vertically aligned over at least one second storage location of said plurality of storage locations; and a transport mechanism capable of transporting said plurality of pods to and from each of said plurality of storage locations from above and/or from a side of said plurality of storage locations and to and from the plurality of process tools from above and/or from a side of said plurality of process tools without handoff of said plurality of pods during transport of the pods between said plurality of storage locations and between said plurality of storage locations and said plurality of process tools.

2. A system for storing a plurality of pods within a tool bay and for transferring said plurality of pods around within the tool bay as recited in claim 1, wherein said transport mechanism comprises a shuttle having a gripper for gripping and transporting the pods.

3. A system for storing a plurality of pods within a tool bay and for transferring said plurality of pods around within the tool bay as recited in claim 2, wherein said gripper is a passive gripper.

4. A system for storing a plurality of pods within a tool bay and for transferring said plurality of pods around within the tool bay as recited in claim 2, wherein said gripper is an active gripper including jaws that open and close for gripping the pod.

5. A system for storing a plurality of pods within a tool bay and for transferring said plurality of pods around within the tool bay as recited in claim 1, wherein said transport mechanism comprises a shuttle having a shelf for supporting the pods at their bottom surface during transport.

6. A system for storing a plurality of pods within a tool bay and for transferring said plurality of pods around within the tool bay as recited in claim 1, wherein said plurality of storage locations comprise shelves for supporting the pods at their bottom surface.

7. A system for storing a plurality of pods within a tool bay and for transferring said plurality of pods around within the tool bay as recited in claim 1, wherein said plurality of storage locations comprise at least one input/output position of an interbay transport.

8. A system for storing a plurality of pods within a tool bay and for transferring said plurality of pods around within the tool bay as recited in claim 1, wherein said transport mechanism is capable of transporting a pod in a vertical plane shared by said storage locations.

9. A system for storing a plurality of pods within a tool bay and for transferring said plurality of pods around within the tool bay as recited in claim 1, wherein said transport mechanism is capable of transporting a pod through a space directly over a storage location having no pod thereon.

10. A system for storing a plurality of pods within a tool bay and for transferring said plurality of pods around within the tool bay as recited in claim 1, further comprising a protective panel in front of said transport mechanism and plurality of storage shelves to substantially isolate said transport mechanism and plurality of storage shelves from human operators within the tool bay.

11. A system for storing a plurality of pods within a tool bay and for transferring said plurality of pods around within the tool bay as recited in claim 1, wherein said transport mechanism transports the pod around the process tool bay solely in a vertical plane.

12. A processing tool bay within a semiconductor fabrication site as recited in claim 11, wherein said plurality of storage locations also share said vertical plane.

13. A transport system within at least a section of a processing tool bay including a plurality of semiconductor processing tools and a plurality of storage locations, the transport system, comprising:
    a transport mechanism capable of transferring the container to and/or between the plurality of processing tools and the plurality of storage locations;
    wherein said transport mechanism transports the container only in a vertical plane; and
    wherein said transport mechanism is capable of approaching a process tool of said plurality of process tools and a storage location of said plurality of storage locations from the side and/or from above.

14. A transport system as recited in claim 13, wherein said transport system comprises a shuttle including a gripper for supporting the container.

15. A system for storing a plurality of pods within a tool bay and for transferring said plurality of pods around within the tool bay as recited in claim 14, wherein said gripper is capable of traveling in a space over a pod and beneath the next above adjacent storage location when said gripper is not transporting a pod.

16. A processing tool bay within a semiconductor fabrication site, at least a section of the processing tool bay comprising:
    a plurality of processing tools for processing semiconductor wafers, each processing tool of said plurality of processing tools including an input/output port for transfer of a substrate-carrying container into and out of said each processing tool; and
    a plurality of storage locations for storing the substrate-carrying container;
    wherein said input/output ports of said plurality of processing tools and said plurality of storage locations are positioned in a common vertical plane; and
    wherein positions of said plurality of storage locations are located within said common plane independently of positions of said input/output ports of said plurality of processing tools.

17. A processing tool bay within a semiconductor fabrication site as recited in claim 16, wherein the processing tool bay does not include a stocker.

18. A processing tool bay within a semiconductor fabrication site as recited in claim 16, wherein the processing tool bay does not include local tool buffers.

19. A processing tool bay within a semiconductor fabrication site as recited in claim 16, wherein at least one of said plurality of storage locations is located at least partially vertically above said input/output port.

20. A transport system within a semiconductor fabrication site, the site including a plurality of processing tool bays, and an interbay transport system for transferring a substrate-carrying container to a delivery position within a processing tool bay of the plurality of processing tool bays, the processing tool bay further including a plurality of semiconductor processing tools and a plurality of storage locations, the transport system comprising:
    at least one shuttle associated with the processing tool bay, said at least one shuttle including means for gripping the container and capable of translation vertically and horizontally, and said at least one shuttle capable of transferring the container between the delivery position, the plurality of processing tools, and the plurality of storage locations without hand off of the container.

21. A transport system within a semiconductor fabrication site as recited in claim 20, wherein said at least one shuttle comprises two shuttles.

22. A transport system within a semiconductor fabrication site as recited in claim 21, wherein a first shuttle of said two shuttles moves a first container to an input/output port of the processing tool as a second of said two shuttles removes a second container from said input/output port of the processing tool.

23. A processing tool bay within a semiconductor fabrication site, at least a section of the processing tool bay comprising:
    a plurality of processing tools for processing semiconductor wafers, each processing tool of said plurality of processing tools including an input/output (I/O) port for transfer of a substrate-carrying container into and out of said each processing tool; and
    a plurality of storage locations for storing the substrate-carrying container, at least one storage location of said plurality of storage locations being in the same vertical plane as at least some of said I/O ports of said plurality of processing tools and said at least one storage location being located at least partially vertically above one I/O port of said at least some I/O ports.

24. A processing tool bay within a semiconductor fabrication site as recited in claim 23 further comprising a transport mechanism for transporting the substrate-carrying container to said plurality of processing tools and said plurality of storage locations, said transport mechanism not being dedicated to any particular process tool, storage location of said plurality of storage locations or group of storage locations of said plurality of storage locations.

25. A processing tool bay within a semiconductor fabrication site, the processing tool bay including a plurality of processing tools for processing substrates, each processing tool of said plurality of processing tools including an input/output port for transfer of a substrate-carrying container into and out of said each processing tool, at least a section of the processing tool bay comprising:

a plurality of storage locations for storing the substrate-carrying container, at least one of said plurality of storage locations being positioned at least partially vertically above at least one input/output port of said plurality of processing tools; and a transport mechanism for transporting the substrate-carrying container around the process tool bay in a plane shared by said plurality of storage locations.

26. A processing tool bay within a semiconductor fabrication site as recited in claim 25, wherein said plurality of storage locations are aligned in a plurality of rows along a wall of the processing tool bay.

27. A processing tool bay within a semiconductor fabrication site as recited in claim 25, wherein said plurality of storage locations are aligned in a plurality of columns along a wall of the processing tool bay.

28. A processing tool bay within a semiconductor fabrication site as recited in claim 25, wherein said plurality of storage locations are mounted on modular sections, which may be affixed to a wall of the processing tool bay.

29. A processing tool bay within a semiconductor fabrication site as recited in claim 28, wherein said sections, and the number of storage locations provided thereon, are scalable to fit within tool bays of different dimensions.

30. A processing tool bay within a semiconductor fabrication site as recited in claim 25, wherein said plurality of storage locations comprise shelves for supporting the containers at their bottom surface.

31. A processing tool bay within a semiconductor fabrication site as recited in claim 25, wherein said plurality of storage locations comprise at least one input/output position of an interbay transport.

32. A processing tool bay within a semiconductor fabrication site, the processing tool bay including a plurality of processing tools for processing substrates, each processing tool of said plurality of processing tools including an input/output port for transfer of a substrate-carrying container into and out of said each processing tool, at least a section of the processing tool bay comprising:

a plurality of storage locations for storing the substrate-carrying container, at least one of said plurality of storage locations being positioned at least partially vertically above at least one input/output port of said plurality of processing tools; and a transport system for transporting the substrate-carrying container around the process tool bay solely in a vertical plane.

33. A processing tool bay within a semiconductor fabrication site as recited in claim 32, wherein said plurality of storage locations also share said vertical plane.

* * * * *